(12) United States Patent
Chen

(10) Patent No.: US 10,795,395 B2
(45) Date of Patent: Oct. 6, 2020

(54) BANDGAP VOLTAGE REFERENCE CIRCUIT CAPABLE OF CORRECTING VOLTAGE DISTORTION

(71) Applicant: eMemory Technology Inc., Hsin-Chu (TW)

(72) Inventor: Chih-Chun Chen, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/576,710

(22) Filed: Sep. 19, 2019

(65) Prior Publication Data

US 2020/0159272 A1 May 21, 2020

Related U.S. Application Data

(60) Provisional application No. 62/768,099, filed on Nov. 16, 2018, provisional application No. 62/791,870, filed on Jan. 13, 2019.

(51) Int. Cl.
| | |
|---|---|
| *G05F 3/24* | (2006.01) |
| *H03F 3/195* | (2006.01) |
| *G05F 3/30* | (2006.01) |
| *G05F 3/26* | (2006.01) |

(52) U.S. Cl.
CPC ............. *G05F 3/24* (2013.01); *G05F 3/267* (2013.01); *G05F 3/30* (2013.01); *H03F 3/195* (2013.01)

(58) Field of Classification Search
CPC ... G05F 3/08; G05F 3/16; G05F 3/222; G05F 3/225; G05F 3/24; G05F 3/242; G05F 23/245; G05F 3/30
See application file for complete search history.

(56) References Cited

U.S. PATENT DOCUMENTS

| | | | |
|---|---|---|---|
| 6,563,370 B2 | 5/2003 | Coady | |
| 9,804,614 B2 | 10/2017 | Ji | |
| 10,642,304 B1 * | 5/2020 | Shreepathi Bhat | ..... G05F 3/245 |

(Continued)

OTHER PUBLICATIONS

Amer Hani Atrash et al., "A Bandgap Reference Circuit Utilizing Switching to Reduce Offsets and a Novel Technique for Leakage Current Compensation," Poster Session IV: Analog & Mixed Signal Design, 2004 IEEE, pp. 297-300.

*Primary Examiner* — Gustavo A Rosario-Benitez
(74) *Attorney, Agent, or Firm* — Winston Hsu

(57) ABSTRACT

A bandgap voltage reference circuit includes an amplifier, a voltage buffer, a first transistor, a first resistor, a second transistor, a second resistor, and a leakage current. The input terminals of the amplifier are coupled to a first reference node and a second reference node respectively. The voltage buffer is coupled to the output terminal of the amplifier for outputting a bandgap reference voltage. The first transistor is coupled to the first reference node, the second first resistor, and can receive the bandgap reference voltage. The second resistor is coupled to the first resistor and a system voltage terminal. The second transistor is coupled to the second reference node, the first resistor, and can receive the bandgap reference voltage. The leakage current compensation element is coupled to the second transistor and the system voltage terminal. A size of the first transistor is greater than the second transistor.

8 Claims, 4 Drawing Sheets

(56) References Cited

U.S. PATENT DOCUMENTS

| | | | |
|---|---|---|---|
| 2002/0017898 A1* | 2/2002 | Bayer | H02M 3/073 |
| | | | 323/313 |
| 2005/0077952 A1* | 4/2005 | Okada | G05F 3/30 |
| | | | 327/539 |
| 2008/0042736 A1* | 2/2008 | Byeon | G05F 1/465 |
| | | | 327/539 |
| 2011/0102058 A1* | 5/2011 | Conte | G05F 3/30 |
| | | | 327/512 |
| 2017/0269627 A1 | 9/2017 | Cook | |
| 2017/0315576 A1* | 11/2017 | Tang | G05F 1/461 |
| 2018/0113485 A1 | 4/2018 | Kiuchi | |
| 2020/0019203 A1* | 1/2020 | Kim | G05F 3/265 |

* cited by examiner

BANDGAP VOLTAGE REFERENCE CIRCUIT CAPABLE OF CORRECTING VOLTAGE DISTORTION

CROSS REFERENCE TO RELATED APPLICATIONS

This non-provisional application claims priority of US provisional application No. 62/768,099, filed on Nov. 16, 2018 and U.S. provisional application No. 62/791,870, filed on Jan. 13, 2019 included herein by reference in its entirety.

BACKGROUND OF THE INVENTION

1. Field of the Invention

The present invention is related to a bandgap voltage reference circuit, and more particularly, to a bandgap voltage reference circuit capable of correcting voltage distortion.

2. Description of the Prior Art

A band-gap voltage reference circuit is widely used in integrated circuits for producing a fixed voltage regardless of power supply variations, temperature changes and circuit loading from a device. The fixed voltage can be used as a reference voltage by charge pumps for providing other high voltages required by the system. Therefore, the stability of the band-gap reference voltage can be crucial to the system.

In prior art, although the band-gap voltage reference circuit can provide a stable bandgap reference voltage within a certain thermal range, the distortion of the bandgap reference voltage will become significant when the temperature reaches a threshold value. FIG. 1 shows a relation between the bandgap reference voltage and temperature. In FIG. 1, the bandgap reference voltage can remain at a stable value around 1.044 when the temperature is between −45V and 155° C. However, once the temperature becomes higher than 155V, the bandgap reference voltage will increase dramatically due to the internal leakage current, making the system unstable.

SUMMARY OF THE INVENTION

One embodiment of the present invention discloses a bandgap voltage reference circuit. The bandgap voltage reference circuit includes a first current source, a second current source, an amplifier, a first transistor, a second transistor, a first resistor, a second resistor, and a leakage current compensation element.

The first current source is coupled to a first reference node, and provides a first current. The second current source is coupled to a second reference node, and provides a second current.

The amplifier has a first input terminal coupled to the first reference node, a second input terminal coupled to the second reference node, and an output terminal. The voltage buffer is coupled to the output terminal of the amplifier, and outputs a bandgap reference voltage.

The first transistor has a first terminal for receiving the first current, a second terminal, and a control terminal for receiving the bandgap reference voltage. The first resistor has a first terminal coupled to the second terminal of the first transistor, and a second terminal. The second resistor has a first terminal coupled to the second terminal of the first resistor, and a second terminal coupled to a first system voltage terminal. The second transistor has a first terminal for receiving the second current, a second terminal coupled to the second terminal of the first resistor, and a control terminal for receiving the bandgap reference voltage. The size of the first transistor is greater than the second transistor.

The leakage current compensation element has a first terminal coupled to the first terminal of the second transistor, and a second terminal coupled to the first system voltage terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
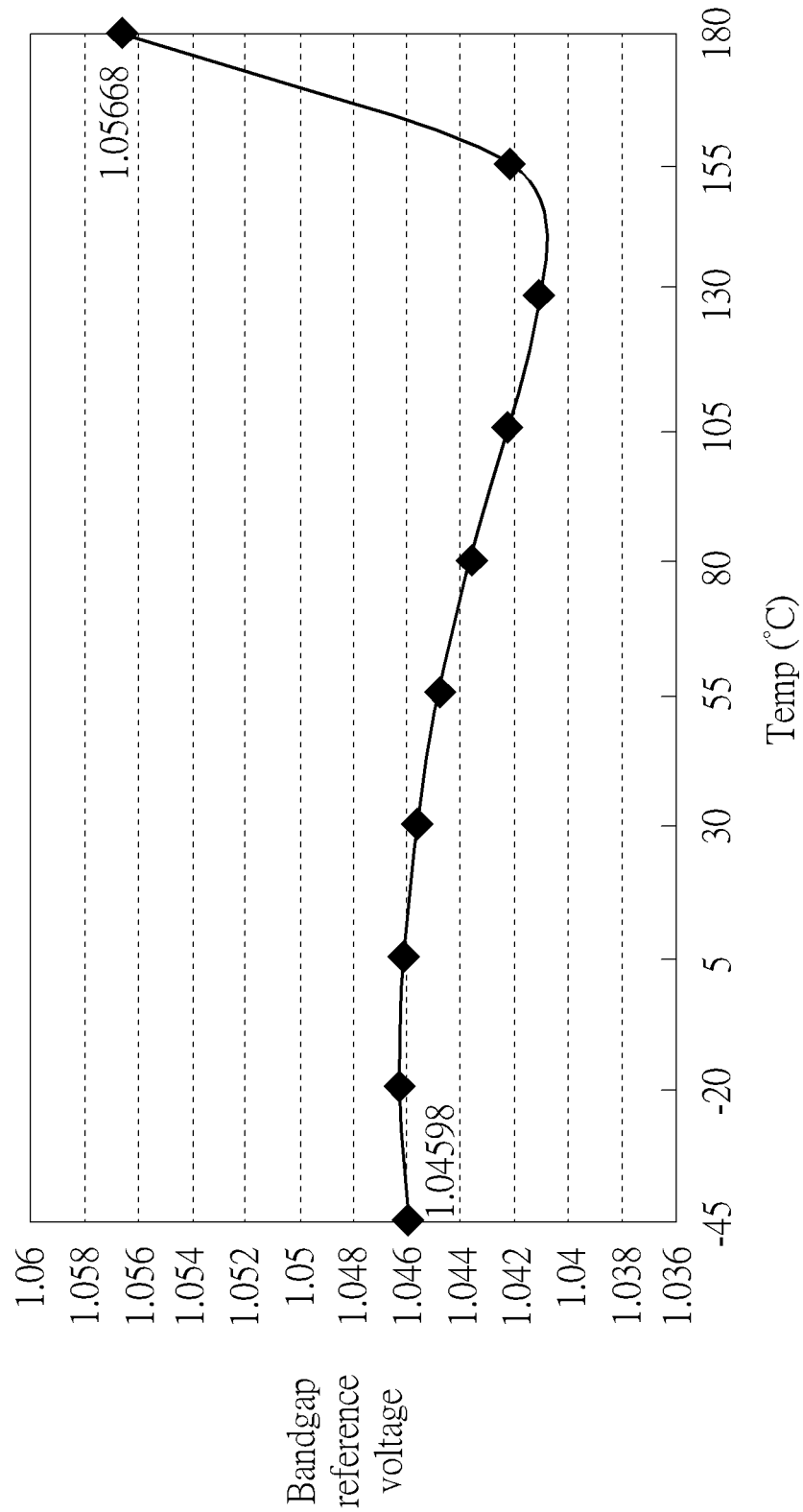
FIG. 1 shows a relation between the bandgap reference voltage and temperature.
Figure 2:
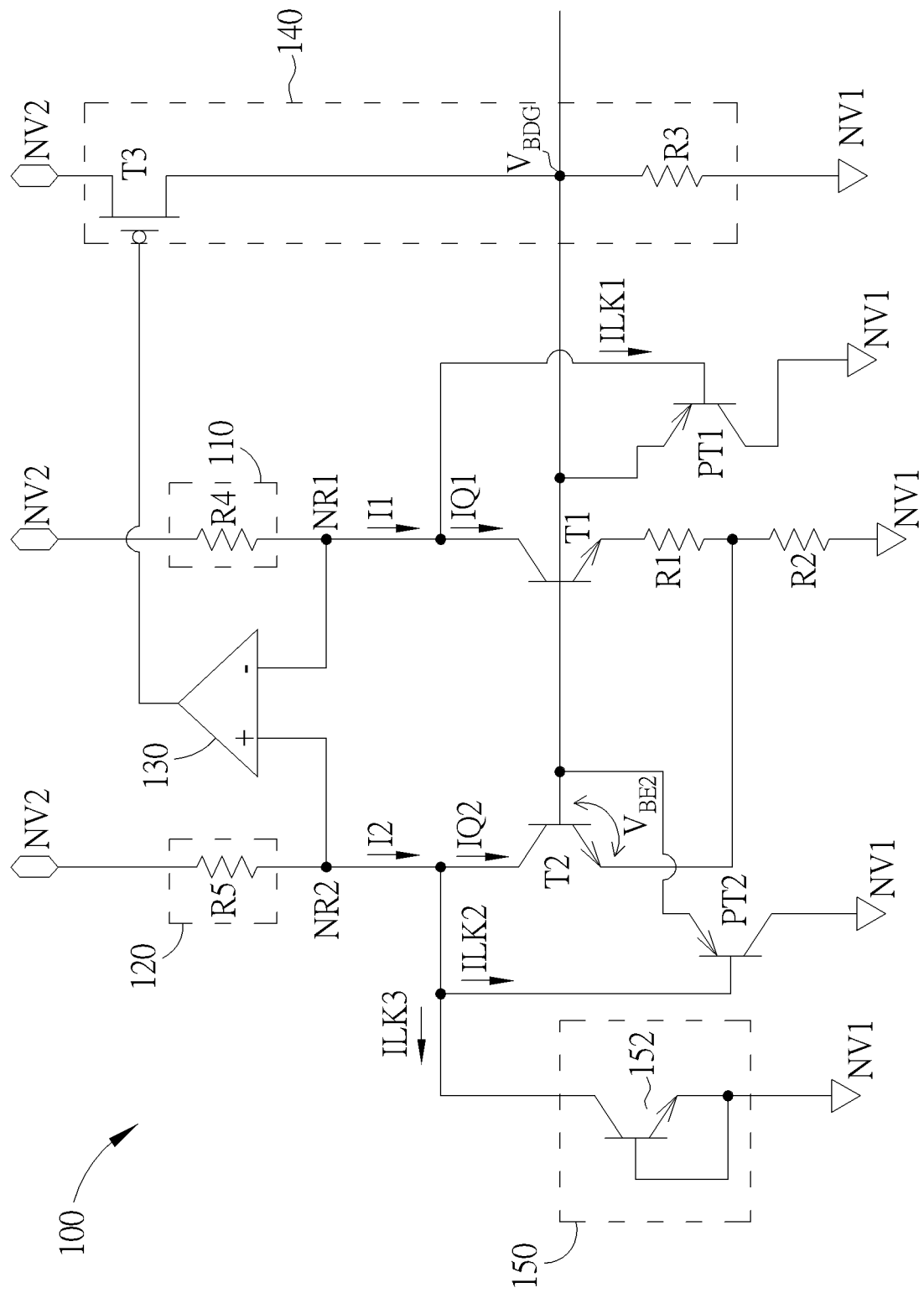
FIG. 2 shows a bandgap voltage reference circuit according to one embodiment of the present invention.

FIG. 2 shows a bandgap voltage reference circuit 100 according to one embodiment of the present invention. The bandgap voltage reference circuit 100 includes a first current source 110, a second current source 120, an amplifier 130, a voltage buffer 140, a first transistor T1, a first resistor R1, a second resistor R2, a second transistor T2, and a leakage current compensation element 150.

The first current source 110 can be coupled to a first reference node NR1, and can provide a first current I1. The second current source 120 can be coupled to a second reference node NR2, and can provide a second current I2.

In FIG. 2, the first current source 110 can include a fourth resistor R4, and the second current source 120 can include a fifth resistor R5. The fourth resistor R4 has a first terminal coupled to a second system voltage terminal NV2 for receiving a second system voltage, and a second terminal coupled to the first reference node NR1. The fifth resistor R5 has a first terminal coupled to a second system voltage terminal NV2, and a second terminal coupled to the second reference node NR2.

The amplifier 130 has a first input terminal coupled to the first reference node NR1, a second input terminal coupled to the second reference node NR2, and an output terminal. The voltage buffer 140 can be coupled to the output terminal of the amplifier 130, and can output a bandgap reference voltage $V_{BDG}$.

In FIG. 2, the voltage buffer 140 includes a third transistor T3, and a third resistor R3. The third transistor T3 has a first terminal coupled to the second system voltage terminal NV2, a second terminal for outputting the bandgap reference voltage $V_{BDG}$, and a control terminal coupled to the output terminal of the amplifier 130. The third resistor R3 has a first terminal coupled to the second terminal of the third transistor T3, and a second terminal coupled to a first system voltage terminal NV1 for receiving a first system voltage. In FIG. 2, the third transistor T3 can be a field effect transistor.

In some embodiments, the second system voltage is greater than the first system voltage. For example, the second system voltage can be the operation voltage of the system, and the first system voltage can be the reference voltage or the ground voltage of the system.

The voltage buffer 140 can be used to buffer the output of the amplifier 130; however, in some other embodiments, according to the system requirement, the amplifier 130 may output the bandgap reference voltage $V_{BDG}$ directly without the voltage buffer 140.

The first transistor T1 has a first terminal coupled to the first reference node NR1 for receiving the first current I1, a second terminal, and a control terminal for receiving the bandgap reference voltage $V_{BDG}$.

The first resistor R1 has a first terminal coupled to the second terminal of the first transistor T1, and a second terminal. The second resistor R2 has a first terminal coupled to the second terminal of the first resistor R1, and a second terminal coupled to the first system voltage terminal NV1.

The second transistor T2 has a first terminal coupled to the second reference node NR2 for receiving the second current I2, a second terminal coupled to the second terminal of the first resistor R1, and a control terminal for receiving the bandgap reference voltage $V_{BDG}$. Furthermore, to reduce the impact of the thermal coefficients of the bandgap reference voltage $V_{BDG}$, the size of the first transistor T1 can be greater than the second transistor T2. In FIG. 2, the size of the first transistor T1 can be N times of the second transistor T2, and N is greater than 1. For example, N can be 8.

In FIG. 2, the first transistor T1 and the second transistor T2 can be NPN bipolar junction transistors (BJT). In this case, the first terminal of the first transistor T1 can be the collector terminal, the second terminal of the first transistor T1 can be the emitter terminal, and the control terminal of the first transistor T1 can be the base terminal. Similarly, the first terminal of the second transistor T2 can be the collector terminal, the second terminal of the second transistor T2 can be the emitter terminal, and the control terminal of the second transistor T2 can be a base terminal.

Figure 3:
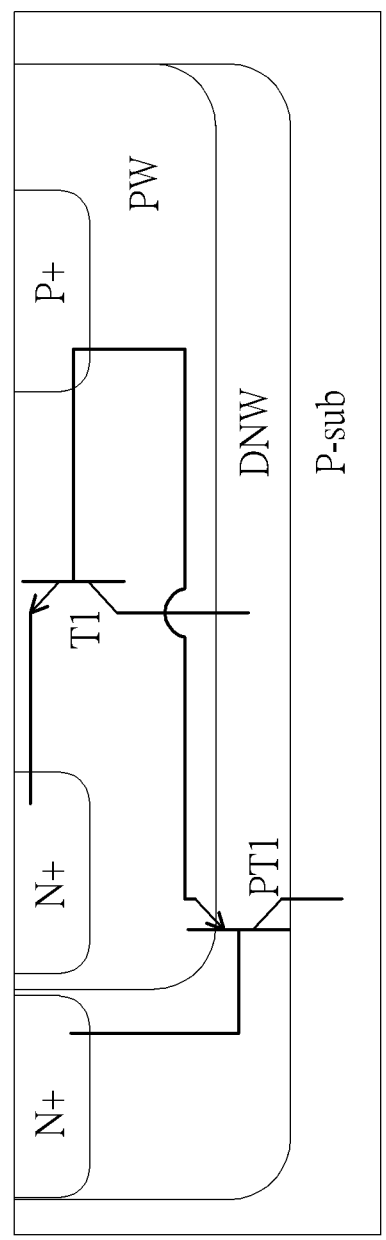
FIG. 3 shows a structure of the first transistor in FIG. 2.

Furthermore, in FIG. 2, parasitic PNP BJTs PT1 and PT2 may exist due to the structures of the first transistor T1 and the second transistor T2. FIG. 3 shows a structure of the first transistor T1. In FIG. 3, the P-type doped region P+ disposed in the P-type well PW can be the base terminal of the first transistor T1, the N-type doped region N+ disposed in the P-type well PW can be the emitter terminal of the first transistor T1, and N-type doped region N+ disposed in the deep N-type well DNW surrounding the P-type well PW can be the collector of the first transistor T1.

Since the deep N-type well DNW is disposed on the P-type substrate P-sub, a parasitic PNP BJT PT1 is formed in the structure shown in FIG. 3. That is, the base terminal of the parasitic PNP BJT PT1 can be the N-type doped region N+ disposed in the deep N-type well DNW, the emitter terminal of the parasitic PNP BJT PT1 can be the P-type doped region P+ disposed in the P-type well PW, and the collector terminal of the parasitic PNP BJT PT1 can be P-type substrate P-sub. Similarly, the parasitic PNP BJT PT2 is formed with the second transistor T2 as shown in FIG. 2.

In some embodiments, the bandgap reference voltage $V_{BDG}$ can be represented by equation (1).

$$V_{BDG}=V_{BE2}+(IQ1+IQ2)*R2 \qquad \text{equation (1)}$$

In equation (1), $V_{BE2}$ can represent the base to emitter voltage of the second transistor T2, IQ1 can represent the current flowing through the first transistor T1, and IQ2 can represent the current flowing through the second transistor T2.

Also, when the bandgap voltage reference circuit 100 reaches to a stable state and starts to output the bandgap reference voltage $V_{BDG}$, the voltage of the first reference node NR1 should be substantially equal to the voltage of the second reference node NR2, and the current I1 should be substantially equal to the current I2. In this case, without the leakage current compensation element 150, the relation between the currents IQ1 and IQ2 may be shown by equation (2).

$$IQ1+ILK1=IQ2+ILK2 \qquad \text{equation (2)}$$

In equation (2), ILK1 represents the leakage current generated by the parasitic PNP BJT PT1, and ILK2 represents the leakage current generated by the parasitic PNP BJT PT2. Since the size of the first transistor T1 is N times of the second transistor T2, the ratio of emitter areas of the first transistor T1 and the second transistor T2 would be N:1. Therefore, the leakage current ILK1 generated by the parasitic PNP BJT PT1 would be N times the leakage current ILK2 generated by the parasitic PNP BJT PT2. Consequently, equation (2) can be rewritten as equation (3).

$$IQ1+(N-1)*ILK2=IQ2 \qquad \text{equation (3)}$$

Combining equation (3) and equation (1), the bandgap reference voltage $V_{BDG}$ can be represented by equation (4).

$$V_{BDG}=V_{BE2}+[2*IQ1+(N-1)*ILK2]*R2 \qquad \text{equation (4)}$$

In equation (4), although the parasitic PNP BJTs PT1 and PT2 are normally turned off, the leakage currents ILK1 and ILK2 will increase dramatically as the temperature increases, thereby causing variation to the bandgap reference voltage $V_{BDG}$.

To reduce the impact of the leakage currents appearing in high temperature cases, the bandgap voltage reference circuit 100 can use the leakage current compensation element 150 to compensate the leakage current ILK1. The leakage current compensation element 150 has a first terminal coupled to the first terminal of the second transistor T2, and a second terminal coupled to the first system voltage terminal NV1.

In FIG. 2, the leakage current compensation element 150 includes an NPN bipolar junction transistor 152. The NPN bipolar junction transistor 152 of the leakage current compensation element 150 has a collector terminal coupled to the first terminal of the leakage current compensation element 150, an emitter terminal coupled to the second terminal of the leakage current compensation element 150, and a base terminal coupled to the emitter terminal of the NPN bipolar junction transistor 152 of the leakage current compensation element 150.

That is, the NPN bipolar junction transistor 152 is turned off normally; however, it may induce the leakage current ILK3. In this case, with the leakage current compensation element 150, the relation between the current IQ1 and IQ2 can be represented by equation (5) instead of equation (2).

$$IQ1+ILK1=IQ2+ILK2+ILK3 \qquad \text{equation (5)}$$

In some embodiments, the ratio of emitter areas of the first transistor T1, the second transistor T2, and the NPN bipolar junction transistor 152 of the leakage current compensation element 150 can be N:1:(N−1). Therefore, the leakage current ILK3 generated by the NPN bipolar junction transistor 152 would be (N−1) times the leakage current ILK2, and equation (5) can be rewritten by equation (6).

$$IQ1=IQ2 \qquad \text{equation (6)}$$

Consequently, the bandgap reference voltage $V_{BDG}$ can be represented by equation (7).

$$V_{BDG}=V_{BE2}+(2*IQ1)*R2 \qquad \text{equation (7)}$$

In equation (7), the voltage variation caused by the leakage current in the bandgap reference voltage $V_{BDG}$ can be removed, so the bandgap voltage reference circuit 100 can generate the bandgap reference voltage $V_{BDG}$ even more stably without being affected by the temperature change.

In FIG. 2, the current sources 110 and 120 can be implemented with resistors R4 and R5. However, in some other embodiments, the current sources 110 and 120 can be implemented with other elements.

Figure 4:
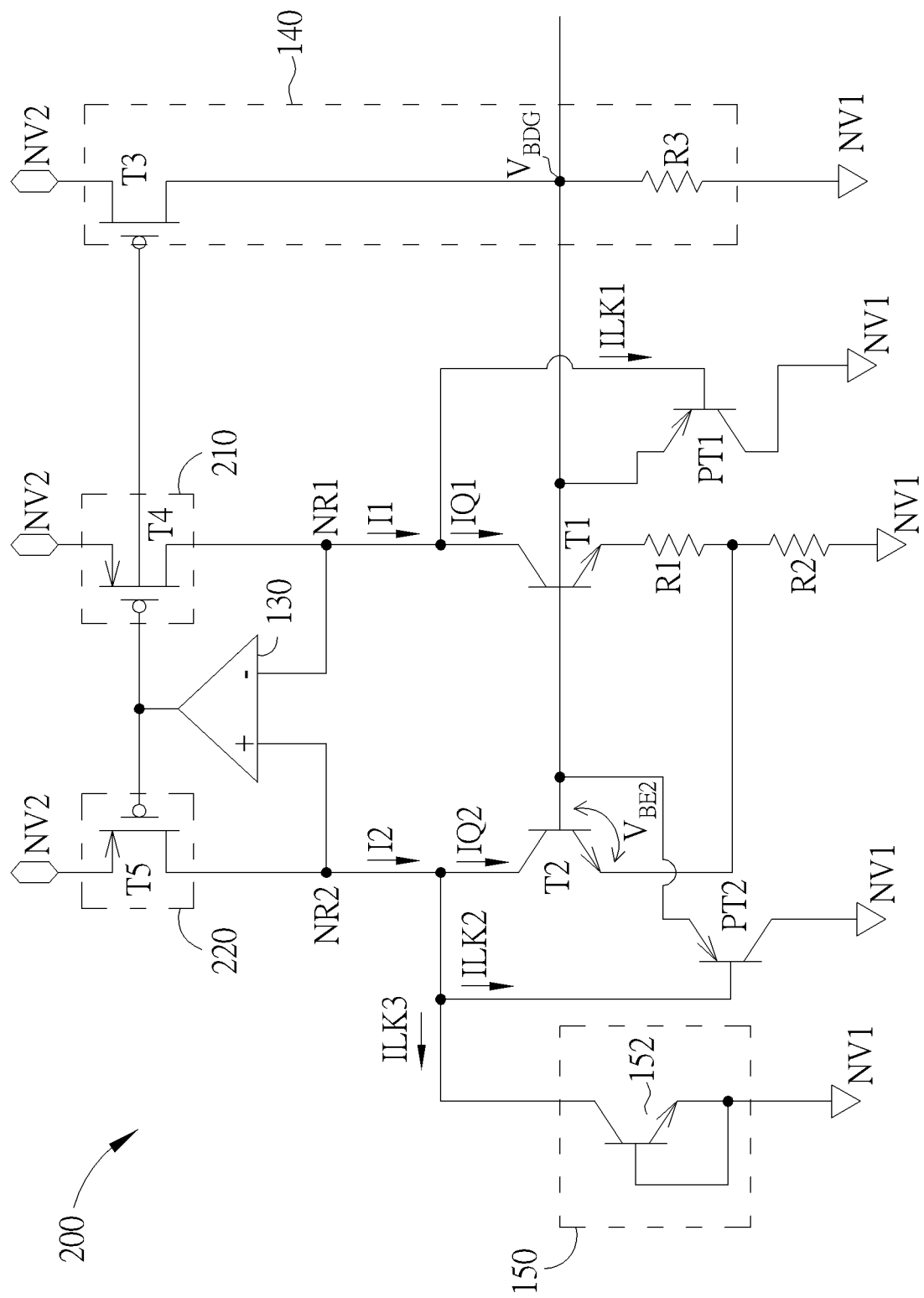
FIG. 4 shows a bandgap voltage reference circuit according to one embodiment of the present invention.

FIG. 4 shows a bandgap voltage reference circuit 200 according to another embodiment of the present invention. The bandgap voltage reference circuits 100 and 200 have similar structures and can be operated with similar principles. However, the bandgap voltage reference circuit 200 can include the first current source 210 and the second current source 220.

In FIG. 4, the first current source 210 includes a fourth transistor T4, and the second current source 220 includes a fifth transistor T5. In some embodiments, the fourth transistor T4 and the fifth transistor T5 can be field effect transistors.

The fourth transistor T4 has a first terminal coupled to the second system voltage terminal NV2, a second terminal coupled to the first reference node NR1, and a control terminal coupled to the output terminal of the amplifier 130. The fifth transistor T5 has a first terminal coupled to the second system voltage terminal NV2, a second terminal coupled to the second reference node NR2, and a control terminal coupled to the output terminal of the amplifier 130.

In summary, the bandgap voltage reference circuit provided by the embodiments of the present invention can correct the voltage distortion caused by the leakage currents in a high-temperature condition with the leakage current compensation element. Therefore, the bandgap voltage reference circuit can generate the bandgap reference voltage stably without being affected by the thermal condition.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bandgap voltage reference circuit comprising:
   a first current source coupled to a first reference node, and configured to provide a first current;
   a second current source coupled to a second reference node, and configured to provide a second current;
   an amplifier having a first input terminal coupled to the first reference node, a second input terminal coupled to the second reference node, and an output terminal;
   a voltage buffer coupled to the output terminal of the amplifier, and configured to output a bandgap reference voltage;
   a first transistor having a first terminal configured to receive the first current, a second terminal, and a control terminal configured to receive the bandgap reference voltage;
   a first resistor having a first terminal coupled to the second terminal of the first transistor, and a second terminal;
   a second resistor having a first terminal coupled to the second terminal of the first resistor, and a second terminal coupled to a first system voltage terminal;
   a second transistor having a first terminal configured to receive the second current, a second terminal coupled to the second terminal of the first resistor, and a control terminal configured to receive the bandgap reference voltage; and
   a leakage current compensation element having a first terminal coupled to the first terminal of the second transistor, and a second terminal coupled to the first system voltage terminal, and the leakage current compensation element comprising an NPN bipolar junction transistor having a collector terminal coupled to the first terminal of the leakage current compensation element, an emitter terminal coupled to the second terminal of the leakage current compensation element, and a base terminal coupled to the emitter terminal of the NPN bipolar junction transistor of the leakage current compensation element;
   wherein a size of the first transistor is greater than the second transistor; and
   wherein a ratio of emitter areas of the first transistor, the second transistor, and the NPN bipolar junction transistor of the leakage current compensation element are N:1:(N−1), wherein N is an integer greater than 1.

2. The bandgap voltage reference circuit of claim 1, wherein:
   the first transistor and the second transistor are NPN bipolar junction transistors.

3. The bandgap voltage reference circuit of claim 2, wherein:
   the first terminal of the first transistor is a collector terminal, the second terminal of the first transistor is an emitter terminal, and the control terminal of the first transistor is a base terminal; and
   the first terminal of the second transistor is a collector terminal, the second terminal of the second transistor is an emitter terminal, and the control terminal of the second transistor is a base terminal.

4. The bandgap voltage reference circuit of claim 1, wherein the voltage buffer comprises:
   a third transistor having a first terminal coupled to a second system voltage terminal, a second terminal configured to output the bandgap reference voltage, and a control terminal coupled to the output terminal of the amplifier; and
   a third resistor having a first terminal coupled to the second terminal of the third transistor, and a second terminal coupled to the first system voltage terminal.

5. The bandgap voltage reference circuit of claim 4, wherein the third transistor is a field effect transistor.

6. The bandgap voltage reference circuit of claim 1, wherein:
   the first current source comprises a fourth transistor having a first terminal coupled to a second system voltage terminal, a second terminal coupled to the first reference node, and a control terminal coupled to the output terminal of the amplifier; and
   the second current source comprises a fifth transistor having a first terminal coupled to the second system voltage terminal, a second terminal coupled to the second reference node, and a control terminal coupled to the output terminal of the amplifier.

7. The bandgap voltage reference circuit of claim 6, wherein the fourth transistor and the fifth transistor are field effect transistors.

8. The bandgap voltage reference circuit of claim 1, wherein:
   the first current source comprises a fourth resistor having a first terminal coupled to a second system voltage terminal, and a second terminal coupled to the first reference node; and the second current source comprises a fifth resistor having a first terminal coupled to a second system voltage terminal, and a second terminal coupled to the second reference node.

\* \* \* \* \*